United States Patent
Nishida et al.

(10) Patent No.: US 7,777,238 B2
(45) Date of Patent: Aug. 17, 2010

(54) CHIP-TYPE LIGHT EMITTING DEVICE AND WIRING SUBSTRATE FOR THE SAME

(75) Inventors: Takanori Nishida, Ninomiya (JP); Satoshi Isoda, Ninomiya (JP); Ryouji Sugiura, Ishioka (JP); Masayuki Sakurai, Tokyo (JP)

(73) Assignee: Hitachi AIC Inc., Tokyo (JP)

( * ) Notice: Subject to any disclaimer, the term of this patent is extended or adjusted under 35 U.S.C. 154(b) by 90 days.

(21) Appl. No.: 11/574,833

(22) PCT Filed: Sep. 6, 2005

(86) PCT No.: PCT/JP2005/016300

§ 371 (c)(1),
(2), (4) Date: Sep. 29, 2008

(87) PCT Pub. No.: WO2006/028073

PCT Pub. Date: Mar. 16, 2006

(65) Prior Publication Data

US 2009/0014732 A1    Jan. 15, 2009

(30) Foreign Application Priority Data

Sep. 7, 2004    (JP) .............................. 2004-259302

(51) Int. Cl.
*H01L 29/18* (2006.01)

(52) U.S. Cl. .................. 257/88; 257/98; 257/E33.056; 257/E33.062; 362/365

(58) Field of Classification Search .................. 257/88, 257/99, E33.056, E33.062; 362/296.01, 362/364, 365, 458
See application file for complete search history.

(56) References Cited

U.S. PATENT DOCUMENTS

2002/0042156 A1* 4/2002 Chen ............................ 438/26
2002/0191382 A1* 12/2002 Miura ........................ 361/760

2003/0189830 A1    10/2003 Sugimoto et al.
2004/0065894 A1*  4/2004 Hashimoto et al. .......... 257/100

FOREIGN PATENT DOCUMENTS

EP    1 387 412 A1    2/2004
JP    01-141788    6/1989

(Continued)

OTHER PUBLICATIONS

JPO English abstract of JP 2000294832 A.*

*Primary Examiner*—A. Sefer
*Assistant Examiner*—Allen L Parker
(74) *Attorney, Agent, or Firm*—Antonelli, Terry, Stout & Kraus, LLP.

(57) ABSTRACT

For providing a chip-type light emitting device, having a plural number of light emitting elements therein, so as to enable to obtain a high optical output with preferable conversion efficiency thereof, and a wiring substrate for that, the chip-type light emitting device, mounting the plural number of the light emitting diodes 30, 30 . . . within an inside of an insulating substrate, has a base substrate 10 and a reflector substrate 20, which is laminated and adhered on an upper surface thereof. In the base substrate 10 is formed a though hole 11, on the reverse surface of which is formed a heat radiating plate 12 made from a thick metal thin film. Also, on an inner periphery and a bottom portion of the through hole are formed a reflection film 13, and further wiring patterns 14, 14 . . . are formed on the substrate. On the other hand, the reflector substrate 20 is formed with a through hole 21, having a diameter larger than that of the through hole of the base substrate, and on an inner peripheral surface thereof is formed a reflection film 22. This reflector substrate is disposed and adhered on an upper surface of the base substrate, at such the position that portions of the wiring patterns are exposed through the through hole thereof, and the plural number of the light emitting diodes are connected to the wiring patterns on the base substrate, to be mounted thereon.

12 Claims, 7 Drawing Sheets

FOREIGN PATENT DOCUMENTS

| | | |
|---|---|---|
| JP | 07-235696 | 9/1995 |
| JP | 11-237850 | 8/1999 |
| JP | 2000-223752 | 8/2000 |
| JP | 2000294832 A * | 10/2000 |
| JP | 2002-094122 | 3/2002 |
| JP | 2002-344108 | 11/2002 |
| JP | 2003-031850 | 1/2003 |
| WO | WO 02/084750 | 10/2002 |

* cited by examiner

CHIP-TYPE LIGHT EMITTING DEVICE AND WIRING SUBSTRATE FOR THE SAME

TECHNICAL FIELD

The present invention relates to a chip-type light emitting device, mounting a plural number of light emitting elements within an inside of a substrate thereof, being applicable to be a backlight for various kinds of display panels or a liquid crystal display apparatus, or a light source for a lightening unit, etc., and further, it relates to a wiring substrate for the same.

BACKGROUND ARTS

Conventionally, the chip-type light emitting device, such as, a chip-type LED, representatively, is applied to be a backlight for the display panels or the liquid crystal display apparatus, or to be a light source of the lightening unit, etc. With such the light emitting devices, in recent years, the field of application thereof is also further expanded or widen, accompanying with an expansion or widening of the field of application where the flat panels are applied into. Accompanying with such the expansion or widening of the field of application, for such the chip-type light emitting devices, it is also requested to increase an amount of light emission with respect to a consumption of electric power therein; i.e., an improvement in the conversion efficiency into lights, as well as, an increase in the amount of light emission from the element itself. And, further, it is also strongly requested for the chip-type light emitting devices, having the structures being suitable for mass production, and therefore being producible with relatively cheap costs, in particular.

However, with the chip-type light emitting devices of the conventional art, in general, as shown in the following Patent Documents 1 to 3, for example, it is manufactured with using a wiring board, which is obtained through forming a through-hole or a hole having a tapered surface in a part of an insulated substrate, and further forming wiring patterns for electric connection on the surface thereof. Namely, one (1) piece of the light emitting diode or the like, for example, is mounted on a heat radiation plate made from a metal thin plate or film, which is attached on a bottom surface of the through-hole of the wiring substrate mentioned above, and thereafter, electrodes of the element are connected onto the above-mentioned wiring patterns through the wire bonding; thereby completing the chip-type light emitting device.

Patent Document 1: Japanese Patent No. 3,137,823;
Patent Document 2: Japanese Patent Laying-Open No. 2000-223752 (2000); and
Patent Document 3: Japanese Patent Laying-Open No. 2003-31850 (2003).

DISCLOSURE OF THE INVENTION

Problem(s) to be Dissolved by the Invention

However, the mounting structure of the chip-type light emitting device according to the conventional art mentioned above is that of mounting only one (1) piece of the light emitting element, such as, the light emitting diode, for example, onto each of the substrates, and therefore it is not the structure, being suitable for mounting a plural number of light emitting elements within an inside thereof, for dealing with an increase of amount of lights emitted from each of those elements, as was mentioned above.

Thus, with such the structures known by the Patent Document 1 mentioned above, the metal thin plate attached on the reverse surface of the through hole is connected to the wiring pattern, thereby connecting one of electrodes of the light emitting diode to be mounted within the inside thereof onto the said metal thin plate, while connecting the other electrode onto the other connection wiring pattern, which is also formed in a part of the wiring substrate (or circuit board), through wire bonding or the like, for example. However, the other connection wiring pattern, which is formed in the part of the wiring substrate, has not the structures being suitable for manufacturing, in particular, when mounting the plural number of light emitting diodes on the metal thin plate attached on the reverse surface of the through hole.

Also, with the structures known by the Patent Document 1 mentioned above, the other electrode of the light emitting diode to be mounted therein is connected onto the connection wiring pattern, which is formed in a part of the wiring substrate through the wire bonding, etc., and thereafter, the through hole mounting the light emitting diode therein is filled up with a transparent resin injected therein; thereby, building up an optic element. However, since the wire bonding between the electrode of the light emitting diode and the wiring pattern protrudes or stick out, into an upper portion of the wiring substrate mentioned above, then it comes to be an obstacle in the process thereafter, i.e., filling up the through hole with the transparent resin injected therein, and therefore it is impossible to carry out the injection of the transparent resin, correctly. Further, the Patent Document 1 mentioned above also disclosed therein the structures of providing a reflection case plate on an upper surface of the wiring substrate, surrounding the through hole, which mounts the light emitting diode in the inside thereof. However, with such the structures, it is difficult to attach the said reflection case plate, correctly, and further, a part of the lights emitting from the light emitting diode leaks or comes outside from the connecting portion between the wiring substrate and the reflection case plate, and therefore, the efficiency is lowered down, in particular, of converting into lights. It is also true much more, in particular, when the light emitting diodes are mounted within the through hole mentioned above in the plural number thereof.

Moreover, with the structures known by the Patent Documents 2 and 3 mentioned above, attaching a metal thin plate on the reverse surface of the through hole, which is formed in the insulating substrate, as to be a heat radiating plate, and disposing the light emitting diode on a surface thereof, but differing from the Patent Document 1 mentioned above, the electrical connection of the electrode of the light emitting diode is made between the wiring patterns, which are formed on the surface of the substrate. However, still from such the structures thereof, it is not suitable for installing or mounting the plural number of light emitting diodes upon the metal thin plate attached on the reverse surface of the through hole. Thus, still with the structures known by those Patent Documents 2 and 3, they have the same problem as was mentioned above.

Then, according to the present invention, being accomplished by taking the problems of the conventional arts mentioned above into the consideration thereof, and an object of the present invention, in more details thereof, is to provide a chip-type light emitting device, mounting a plural number of light emitting elements within an inside thereof, and in particular, enabling to obtain an increase or improvement on the light conversion efficiency thereof, and further, the structures of the chip-type light emitting device, being suitable for the mass production thereof and therefore rather cheaply producible, and also the wiring substrate for use thereof.

Means for Dissolving the Problem(s)

For accomplishing the object(s) mentioned above, according to the present invention, there is provided a chip-type light emitting device, or a wiring substrate, comprising: a base substrate for mounting the light emitting elements to be stored therein, and a reflector substrate, being laminated and adhered on a surface of said base substrate, wherein said base substrate is formed with a non-through hole within the inside of which the light emitting elements are mounted, in a part thereof, and with wiring patterns for electrically connecting said light emitting elements, on an upper end periphery portion thereof, and further on a bottom surface of said non-through hole (i.e., a hole opening having a bottom surface) is formed a heat radiating conductive body, which is thicker than the thickness of a metal thin film for forming said wiring patterns, and said reflector substrate is formed with a through hole having a diameter larger than that of said non-through hole, but without covering over the non-through hole formed on said base substrate, and on an inner peripheral surface thereof is formed a reflection film made from a metal thin film, and further, parts of the wiring patterns (i.e., light emitting element connecting lands) are formed on the upper end periphery portion of the non-through hole of said base substrate while exposing them upon the bottom surface of the through hole of that reflector substrate, when said reflector substrate is disposed on an upper surface of said base substrate.

Also, according to the present invention, within the chip-type light emitting device, or the wiring substrate, as described in the above, it is preferable that the reflection film made from the metal thin film, being formed on the inner peripheral surface of the through hole of said reflector substrate, or on the inner peripheral surface of the non-through hole of said base substrate, is made from a metal thin film of any one of silver, nickel and aluminum, being superior in reflection efficiency to a white-color light.

Further, according to the present invention, within the chip-type light emitting device, or the wiring substrate, as described in the above, it is preferable that on an end surfaces of said base substrate and said reflector substrate laminated and adhered thereon are further formed through holes in plural numbers thereof, penetrating through both substrates, to be cut out along a line connecting around centers of the through holes of said both substrates after mounting the light emitting elements therein, and on an inner periphery of said through holes are formed conductive layers, being electrically connected with the portions of said wiring patterns (i.e., light emitting element connecting lands), which are formed on the periphery portion of the through hole of said base substrate, respectively, thereby providing terminal electrodes for connecting said light emitting elements to an outside.

Also, according to the present invention, within the chip-type light emitting device, or the wiring substrate, as described in the above, it is preferable that non-through holes are formed in the terminal electrodes of said wiring substrates, being closed at either an upper end surface of said reflector substrate or a lower end surface of said base substrate in the through hole penetrating through both substrates, i.e., the base substrate and said reflector substrate laminated and adhered on the upper surface thereof, and said both substrates are cut out along around centers of the non-through holes thereof after mounting the light emitting elements therein, thereby providing the terminal electrodes.

In addition thereto, according to the present invention, within the chip-type light emitting device, or the wiring substrate, as described in the above, it is preferable that the non-through hole of said base substrate is made by a non-through hole of φ2.0 through 6.0 for mounting the plural pieces of light emitting elements within an inside of one (1) piece of the non-through hole.

And, according to the present invention, within the chip-type light emitting device, or the wiring substrate, as described in the above, it is preferable that the reflection surface on the inner periphery of the through hole, which is formed in the reflector substrate laminated and adhered on the upper surface of said base substrate, has a tapered shape widening an upper end surface than the bottom surface of said base substrate (i.e., a taper angle 90°-120°).

BEST MODE FOR CARRYING OUT THE INVENTION

Hereinafter, embodiments according to the present invention will be fully explained, by referring to the attached drawings.

Figure 1:
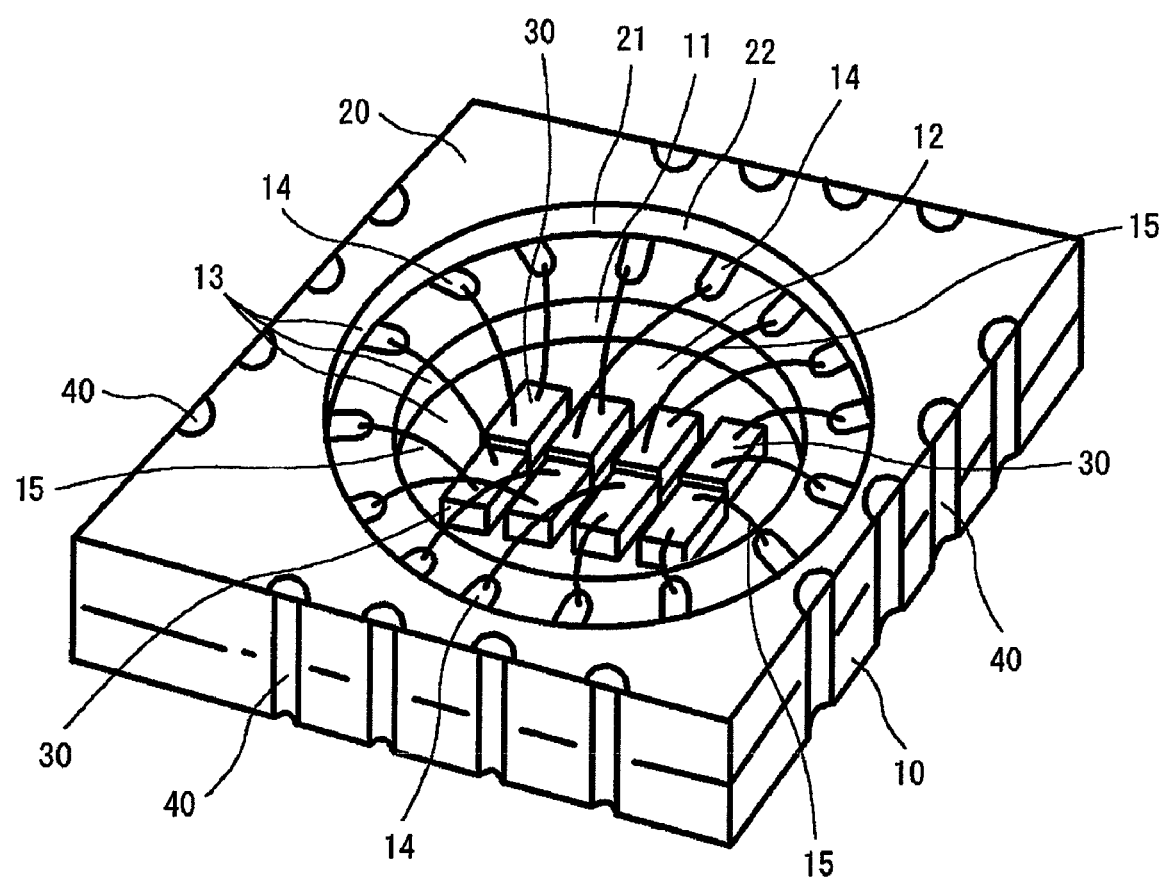
FIG. 1 is an enlarged perspective view for showing the structures of a chip-type light emitting device and a wiring substrate for the same, according to one embodiment of the present invention.

First of all, FIG. 1 shows a chip-type light emitting device, according to an embodiment of the present invention, and a wiring substrate (or a circuit board) for the same. This chip-type light emitting device and also the wiring substrate for the same are formed into a plate-like, being about square in the outer shape thereof, as apparent from that figure, basically comprise a base substrate 10, a reflector substrate 20, which is laminated and adhered on the upper surface of that base substrate, and a plural number of light emitting elements, such as, eight (8) pieces of light emitting diodes 30, 30 . . . , in the present embodiment, for example. However, those plural number of light emitting elements, i.e., the eight (8) pieces of light emitting diodes 30, 30 . . . are aligned and disposed at predetermined positions, upon the surface of a thick metal thin film 12, which is provided on the reverse (or bottom) surface of a through hole 11 formed around a center of the base substrate 10 mentioned above, thereby to form a heat radiating plate. Further, on an inner peripheral surface of the through hole 11, which is built up on the base substrate 10, and the surface of the metal thin film 12 is formed a reflection film 13 in one body or as a unit, being made from such as a metal thin film of silver, etc., for example, although the details of which will be explained latter.

Figure 2:
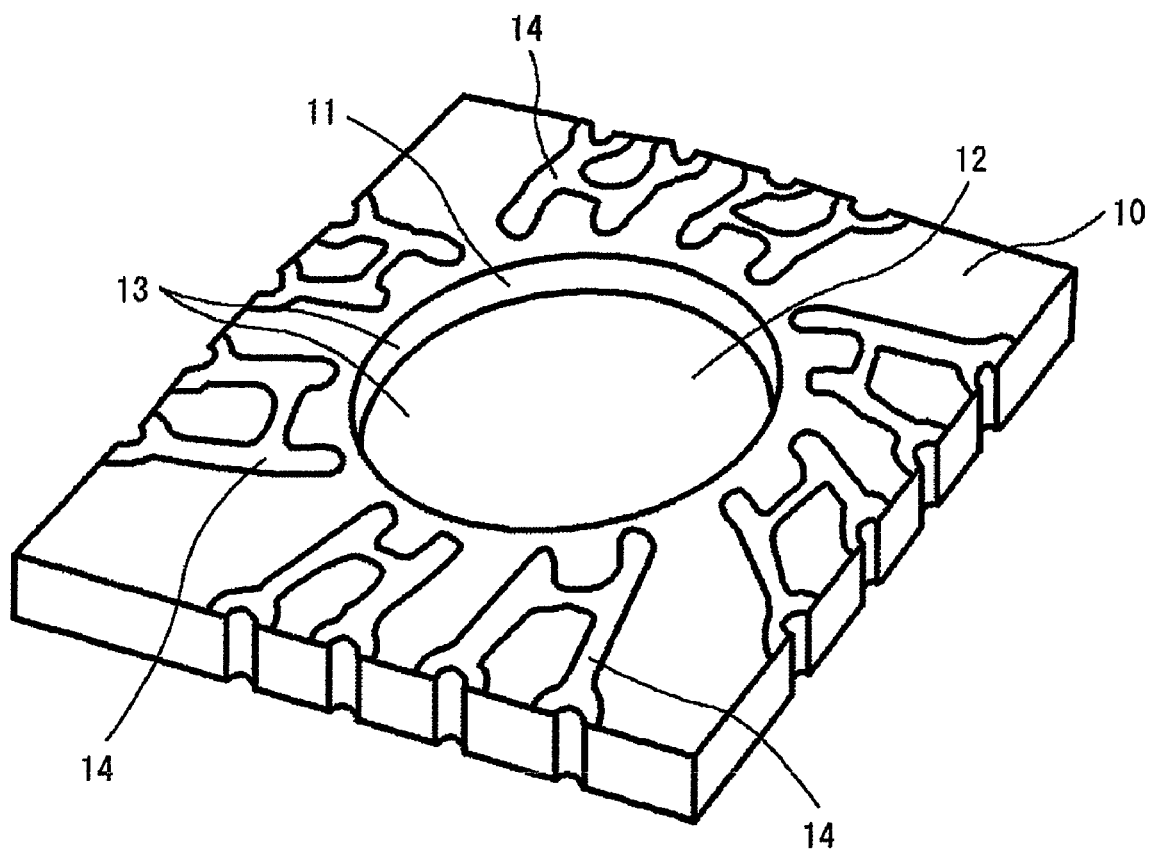
FIG. 2 is an enlarged perspective view for showing the structures of a base substrate, building up the chip-type light emitting device, and the wiring substrate for that, which are mentioned above.

Also, FIG. 2 attached herewith shows only the base substrate 10 building up the chip-type light emitting device mentioned above, and the wiring substrate for the same, but being taken out therefrom, and as is apparent from that figure, on the upper surface of the base substrate 10 are formed so-called wiring patterns 14, 14 . . . , for electrically connecting the plural number of the light emitting diodes 30, 30 . . . with driver circuits provided at a location external thereto (not shown in the figure), each being formed to locate on a periphery portion thereof at an equal distance between them, so that they surround the through hole 11. And in FIG. 1, reference numerals 15, 15 . . . depict wires for electrically connecting those plural number of light emitting diodes 30, 30 . . . between the above-mentioned wiring patterns 14, 14 . . . , which are wired through the wire bonding, for example.

On the other hand, on the reflector substrate 20, which is limited and adhered on the upper surface of the base substrate 10 mentioned above, there is also formed a through hole 21 at around a center thereof, and on the inner peripheral surface of this through hole 21, there is also formed a reflection film 22 made from a metal thin film of silver, etc., for example, although the details of manufacturing thereof will be explained latter. However, this through hole 21 has a diameter of the through hole 11, which is formed on the base substrate 10 mentioned above. And, for that reason, as is apparent from FIG. 1 mentioned above, portions of the wiring patterns 14, 14 . . . are exposed, which are formed on the upper surface of the base substrate 10 mentioned above, in more details, portions of the wiring patterns formed on the periphery portion of the through hole 11 of the base substrate 10, under the condition that the reflector substrate 20 is laminated and adhered on the upper surface of the base substrate 10. Namely, the plural number of the light emitting diodes 30, 30 . . . are disposed on the substrate obtained through laminating and adhering the reflector substrate 20 on the upper surface of the base substrate 10, and thereafter, as was mentioned above, electrical connection can be made between the wiring patterns 14, 14 . . . which are formed on the upper surface of the base substrate 10, for example, through the wire bonding, etc. For that reason, it is possible to connect the wires 15, 15 . . . for electrically connecting between the wiring patterns 14, 14 . . . , within an inside of the two (2) pieces of the substrates (i.e., the base substrate 10 and the reflector substrate 20) which are laminated and adhered, in other words, without making the wire 15 protruding from the upper surface of the reflector substrate 20.

Further, as is apparent from FIG. 1 mentioned above, on each of end surfaces of the base substrate 10 and the reflector substrate 20, building up the chip-type light emitting device and the wiring substrate for the same, there are formed a plural number of end surface electrodes 40, 40 . . . (in this embodiment, 8×2=16 pieces). Thus, with an aid of those end surface electrodes 40, 40 . . . , it is possible to obtain electrical connection between the wiring patterns formed on the substrate, when mounting the said chip-type light emitting device on other board, such as, a mother board or the like, for example.

Following to the above, explanation will be made hereinafter, in particular, about a method for manufacturing the substrate formed through laminating and adhering the base substrate 10 on the reflector substrate 20, in relation to the chip-type light emitting device and the wiring substrate for the same, the detailed structures of which are explained in the above, by referring to FIGS. 3(a) through 5(f).

However, FIGS. 3(a) to 3(g) show the method for manufacturing the base substrate 10 mentioned above, and each of those figures shows the structures on the cross-section thereof, at each of the stages of manufacturing processes for the base substrate 10 mentioned above.

Figure 3A:
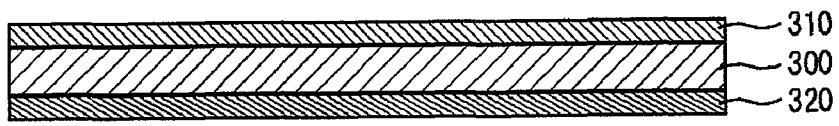
FIGS. 3(a) to 3(g) are step views for showing the manufacturing method of the base substrate mentioned above, each showing the cross-section structures at each step of the manufacturing processes thereof.
Figure 3B:
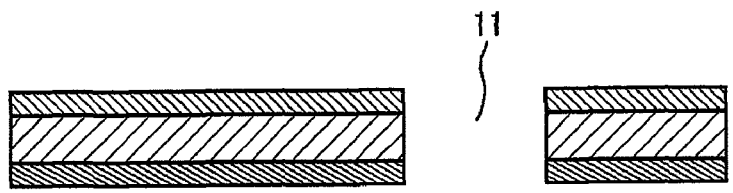
Figure 3C:
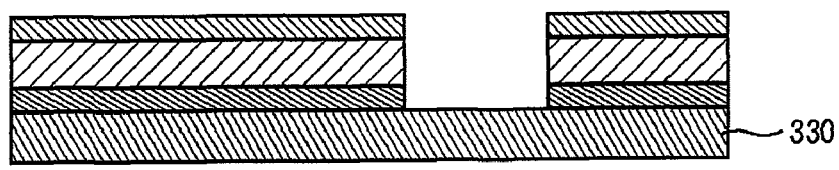
Figure 3D:
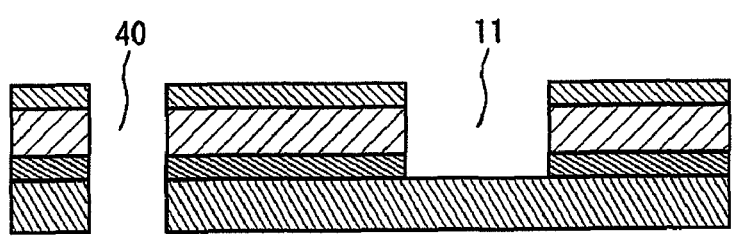
Figure 3E:
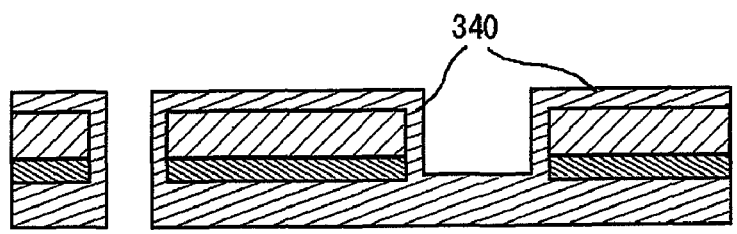

Firstly, a core base-material 300 having thickness of about 0.3 mm, being made of an insulating material, such as, epoxy resin or the like, for example, is prepared and on one surface thereof (i.e., an upper surface in the example of the figure) is attached a copper foil 310 having thickness of about 18 μm while on the other surface thereof (i.e., a lower surface in the example of the figure) is spread an adhesive sheet 320 having thickness of about 25 μm (see FIG. 3(a)). Next, on the surface of the base-material 300 prepared in the above is opened a hole of about Φ3.1, in the present embodiment, through NC, for example, at the position of the through hole 11 (see FIG. 1 mentioned above) (see FIG. 3(b)). Thereafter, on the lower surface of the base-material 300, i.e., on the surface opposite to the surface, on which the copper foil 310 is attached, is adhered a copper foil 330, being thicker than the copper foil 310 mentioned above, i.e., having thickness of about 70 μm, for example (see FIG. 3(c)). Thereafter, at the positions where the end surface electrodes 40, 40 . . . will be formed (see FIG. 1 mentioned above), there are opened holes of about Φ0.6, for example, (see FIG. 3(d)), and further, upon the entire thereof is treated a layer 340 of copper plating, having thickness of about 20 μm (see FIG. 3(e)).

Figure 3F:
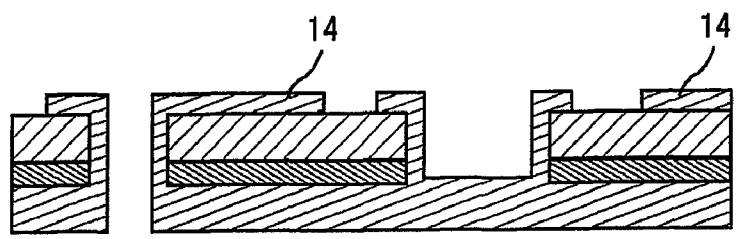
Figure 3G:
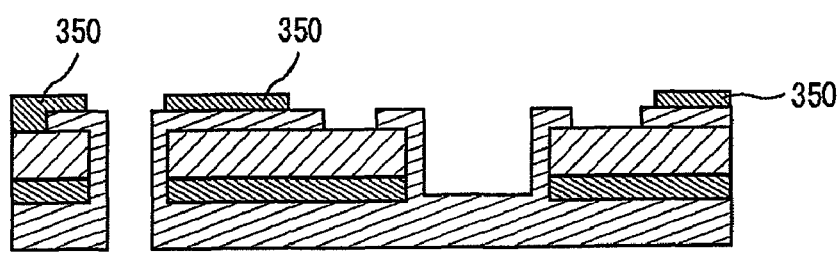

Following to the above, on the upper surface of the base-material 300, i.e., the surface bonding with the reflector substrate 20, a predetermined circuit pattern 14 is formed by removing the copper foil 310 through the etching, for example (see FIG. 3(f)). Thereafter, above the predetermined circuit pattern formed, the adhesive sheet 350 is adhered thereto, on which an opening portion is formed at a predetermined position in advance (see FIG. 3(g)), and thereby obtaining the base substrate 10 mentioned above. Further, an example of the base substrate 10 obtained in the above is shown in FIG. 2 mentioned above.

Next, FIGS. 4(a) to 4(e) attached herewith show a method for manufacturing the reflector substrate 20 mentioned above, and those figures also show the structures on the cross-section thereof, at the each stage of the processes for manufacturing the reflector substrate 20 mentioned above.

Figure 4A:
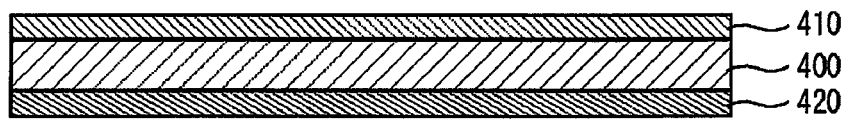
FIGS. 4(a) to 4(e) are step views for showing the manufacturing method of a reflector substrate, each showing the cross-section structures at each step of the manufacturing processes thereof.
Figure 4B:
Figure 4C:
Figure 4D:
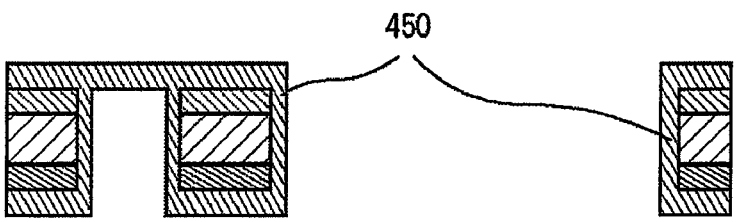
Figure 4E:
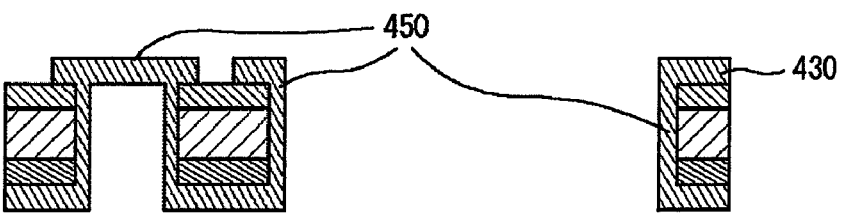
Figure 5A:
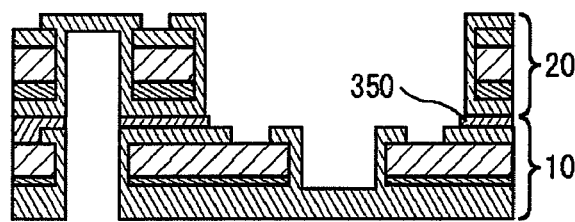
FIGS. 5(a) to 5(f) are step views for showing the method of manufacturing the substrate through laminating and adhering the reflector substrate on the upper surface of the base substrate mentioned above, each showing the cross-section structures at each step of the manufacturing processes thereof.
Figure 5B:
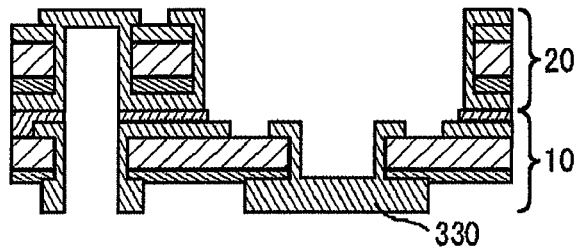
Figure 5C:
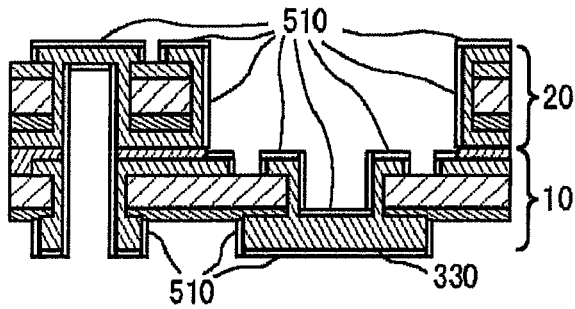
Figure 5D:
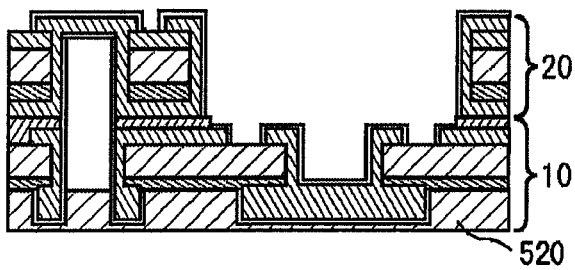
Figure 5E:
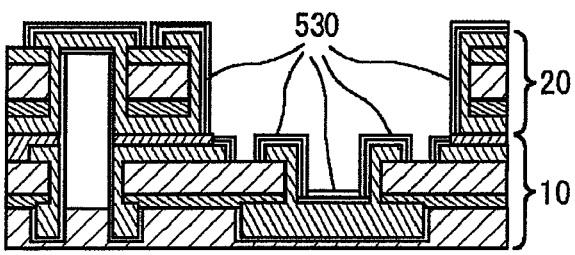
Figure 5F:
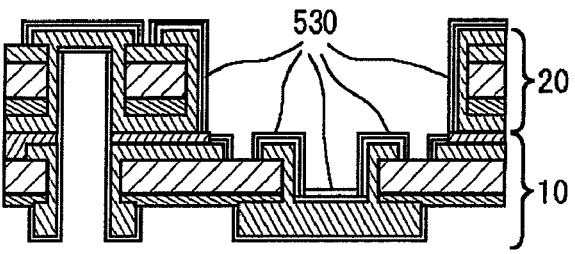

Firstly, also a core base-material 400 is prepared, having thickness of about 0.3 mm, being made of an insulating material, such as, epoxy resin or the like, for example, and on both surfaces thereof are attached adhesive sheets 410 and 420, having thickness of about 25 μm (see FIG. 4(a)). Following to this, on the surface of the base-material 400 mentioned above, a hole of about φ5.0 is opened through NC, for example, at the position of the through hole 21 (see FIG. 1 mentioned above), and at the same time, holes of about φ0.6 are also opened at the positions where the end surface electrodes 40, 40 . . . will be formed (see FIG. 4(*b*)). And, on the (upper) surface of the base-material 400 is adhered a copper foil 430, on which a hole of about φ5.0 is formed at the position of the through hole 21 mentioned above, in advance, while on the reverse (or lower) surface thereof is adhered a copper foil 440, on which a hole of about φ5.0 and other holes are formed at the position of the through hole 21 and the end surface electrodes 40 in advance (see FIG. 4(*c*)). Thereafter, a layer 450 of copper plating, having thickness of about 20 μm is treated upon the entire thereof (see FIG. 4(*d*)), and further the copper foil 430 formed on the (upper) surface of the base-material is removed through the etching, so as to form the predetermined pattern (see FIG. 4(*e*)), and thereby obtaining the reflector substrate 20 mentioned above.

Next, explanation will be made about the processes of laminating and adhering the reflector substrate 20 obtained in the above on the base substrate 10, by referring to FIGS. 5(*a*) to 5(*f*). However, herein also, the reflector substrate 20 and the base substrate 10, which are to be laminated and adhered to each other to be manufactured, are shown by the structures on the cross-section at each stage of the manufacturing processes thereof.

Firstly, the reflector substrate 20, which is obtained in FIG. 4(*e*) mentioned above, is laminated on the base substrate 10, which is obtained in FIG. 3(*g*) mentioned above (see FIG. 5(*a*)). Namely, on the adhesive sheet 350 adhered on the upper surface of the base substrate 10 mentioned above is laminated the reflector substrate 20, to be adhered thereon. Following to this, the copper foil 330 having the thickness of about 70 μm, which is adhered on the lower surface of the base substrate 10 being laminated and adhered, is removed also through the etching or the like, and thereby forming a circuit of solder surface for the chip-type light emitting device (see FIG. 5(*b*)). Thereafter, upon the entire thereof is treated a layer 510 of noble metal plating, such as, being made of a nickel (Ni) layer having thickness of about 5 μm and a gold (Au) layer having thickness of about 0.3 μm, for example (see FIG. 5(*c*)). Further, a masking tape 520 is pasted or struck on the entire lower surface of the base substrate 10 (see FIG. 5(*d*)), and upon the entire thereof is treaded a layer 530 of silver (Ag), with the thickness of about 0.3 μm, for example (see FIG. 5(*e*)). Thereafter, the masking tape, which is stuck on the entire lower surface of the base substrate 10, is peeled out (see FIG. 5(*f*)), and thereby completing the substrate, being made by laminating and adhering the base substrate 10 on the reflector substrate 20. Thereafter, further, within the through hole 11 of the base substrate 10 mentioned above, a plural number of light emitting diodes are disposed on the heat radiating plate 12, which is provided on the reverse (or bottom) surface thereof, and are wired; thereby obtaining the chip-type light emitting device. However, in the processes mentioned in the above, the substrate having a large surface area is used or adopted to build up a large number of substrates in one body, for the purpose of manufacturing a large number of the devices at the same time. And, a one-dot chain line in FIG. 5(*f*) indicates a cutting line for separating and cutting the chip-type light emitting devices into the each chip part, after completing them by mounting the plural number of light emitting diodes on the substrates.

Further, with the wiring substrate for the chip-type light emitting device, which is obtained through the manufacturing processes mentioned above, as is shown in FIG. 6 attached, the plural number of the light emitting diodes 30, 30 . . . are fixed at the predetermined positions thereof, via a mold resin material 60 of high heat transmission or thermal conductivity, on the heat radiating plate (i.e., the metal thin film) 12, which is provided on the reverse (or bottom) surface of the through hole 11 formed around at the central portion of the base substrate 10 building up the substrate mentioned above. And, thereafter, the wiring is conducted through the wire bonding, for example. In that instance, as is apparent from FIG. 1 mentioned above, the wiring patterns 14, 14 . . . for providing the wiring between the light emitting diodes are formed on the (upper) surface of the base substrate 10, being a lower substrate of the laminated substrate of two (2) layers, and portions of those wiring patterns 14, 14 . . . are exposed through the through-hole 21, which is opened on the surface of the reflector substrate adhered thereon; therefore, the electrodes of each of the plural number of light emitting diodes 30, 30 . . . are wired between those wiring patterns 14, 14 . . . through the wire bonding. Further, in this FIG. 6, the wires that are wired are indicated by a reference numeral 16.

In this manner, with such the structures as was mentioned above, the wires 15 provided between the electrodes of the plural number of the light emitting diodes 30, 30 . . . and the wiring patterns 14, 14 . . . can be installed within an inside of the substrate, but without protruding from an (upper) surface of the substrate of the chip-type light emitting device, i.e., the (upper) surface of the reflector substrate 20, into an outside thereof. Thus, with such the structures of the chip-type light emitting device as mentioned above, there is no necessity of filling up a transparent resin in an upper portion thereof, after mounting the light emitting diodes 30, 30 . . . on the substrate, for the purpose of protecting the wiring portions thereof.

Figure 6:
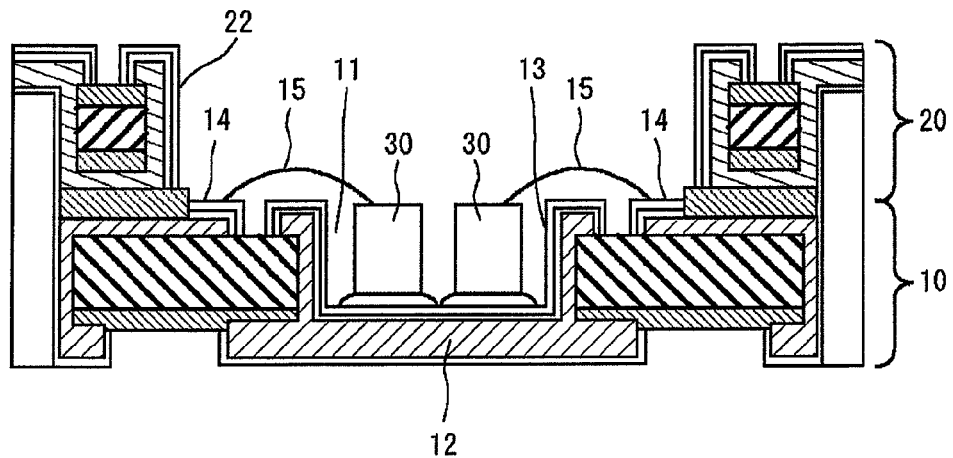
FIG. 6 is a cross-section view for showing the structures of the chip-type light emitting device, mounting a plural number of light emitting elements on the substrate obtained through the above steps.

In other words, it can be applied as the chip-type light emitting device, under the condition of mounting the light emitting diodes 30, 30 . . . within the inside of the substrate, as is shown in FIG. 6 mentioned above, i.e., to be a display panel, a back light for a liquid crystal display device, and a light source for a lightening unit, etc., for example. Further, since it can mount the plural number of the light emitting diodes 30, 30 . . . thereon, as was mentioned above, and therefore it is possible to obtain a high optical output therefrom, and also since there is no necessity of filling up the transparent resin on the upper surface of the light emitting diodes 30, no absorption occurs in a part of the lights emitted from those elements, through the said transparent resin, and therefore it is possible to obtain the chip-type light emitting device, being much higher in the conversion efficiency thereof. In addition thereto, because of no necessity of filling up the transparent resin on the upper surface of the light emitting diodes 30, as was mentioned above, it is possible to escape from the situation that the heat generation within an inside of the elements is disturbed or prevented from being diffused or spread into the periphery by the said transparent resin filled up on the upper surface thereof, or that the heat is confined within an inside of the said resin, so that the light emitting diodes increase the temperature thereof.

Also, as is shown in FIG. 6 mentioned above, on the base substrate 10 building up the wiring substrate is formed the reflector substrate 20 in one body, and in addition thereto, as was mentioned above, the noble metal plating layer 510, being made of the nickel (Ni) layer and the gold (Au) layer, is treated on the entire surfaces thereof, i.e., the bottom surface and the inner periphery surface of the through hole 11 opened on the base substrate 10, and the inner peripheral surface of the through hole 21 opened on the reflector substrate 20, and further on the surface thereof are formed the reflection films 13 and 22, which are made from the silver (Ag) layer 530 (about 1 μm in the thickness thereof). For this reason, the lights emitting from the plural number of the light emitting diodes 30, 30 . . . , which are provided within an inside of the through hole 11 of the base substrate 10, are reflected upon those reflection films 13 and 22, and are guided from an upper portion of the through hole 21 opened on the reflector-substrate 20, but without leaking into an outside thereof. Thus, it is possible to obtain a high optical output by means of the plural number of the light emitting elements, with preferable conversion efficiency.

Figure 7:
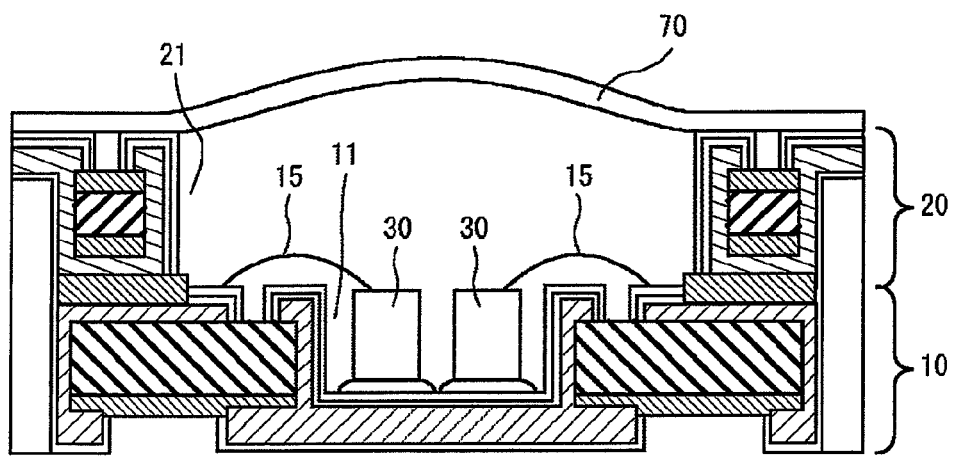
FIG. 7 is a cross-section view for showing the structures of variations of the chip-type light emitting device and the wiring substrate for that, which are mentioned above.

FIG. 7 attached herewith shows a variation of the chip-type light emitting device and also the wiring substrate for that shown in the above. As is apparent from the figure, according to this variation, within the structures of the chip-type light emitting device mentioned above, further a transparent plate-like member 70, such as, of glass or resin, etc., for example, is attached on the (upper) surface of that reflector substrate 20, and in a part of this plate-like member 70 is formed so-called an optical element, for example, a lens or the like, for diffusing the lights, in one body. Thus, with such the structures, in the similar manner to that of the embodiment mentioned above, it is possible to obtain a superior heat radiating property of the light emitting elements, as well as, to obtain a high optical output by means of the plural number of the light emitting elements, with the preferable conversion efficiency. And further, since the output lights are emitted after being diffused, it is suitable for the chip-type light emitting device, in particular, to be applied as the display panel, the back light of the liquid crystal display device, and the light source of the lightening unit, etc. Further, with such the structures, in particular, by means of the plate-like member 70, it is possible to protect the light emitting diodes 30 from being destroyed by a foreign matter, which may invade from an outside of the device into an inside of the through holes 11 and 21, i.e., short-circuiting between the wires 15 or breaking them.

Figure 8:
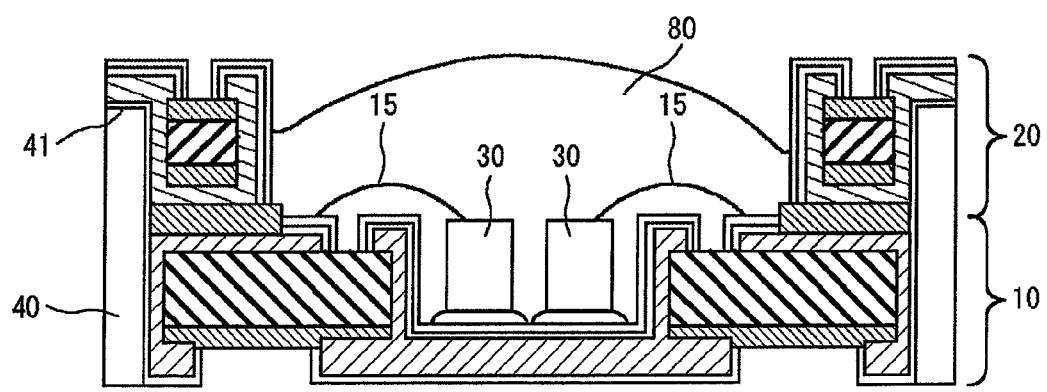
FIG. 8 is a cross-section view for showing the structures of other variations of the chip-type light emitting device and the wiring substrate for that, which are mentioned above.

Further, FIG. 8 attached herewith shows other variation of the chip-type light emitting device shown in the above, and the wiring substrate for that. However, as is apparent from the figure, according to this variation, a transparent resin 80 is filled up within an inside of the through holes 11 and 21, which are opened on the base substrate 10 and the reflector substrate 20 mentioned above, and is harden or solidified while dipping the plural number of the light emitting diodes 30, 30 . . . and the wires 15 for use of wiring thereof into it, and further, it is formed into a convex-like shape, for example, on an outer peripheral surface thereof, thereby forming the so-called optical element in one body. Further, with such the structures, it is possible to obtain the high optical output by means of the plural number of the light emitting elements, with preferable conversion efficiency, and further, since the output lights are emitted after being diffused, it is suitable for the chip-type light emitting device, in particular, to be applied as the display panel, the back light of the liquid crystal display device, and the light source of the lightening unit, etc. Also, it is possible to protect the light emitting diodes 30 in safe, against the invasion of the foreign matter from an outside of the device.

However, in the variations shown in FIGS. 7 and 8 mentioned above, in case if the plural number of the light emitting diodes 30, 30 . . . , which are disposed within an inside of the through holes 11 and 21 opened on the base substrate 10, are blue-color light emitting diodes, for example, it is possible to obtain the chip-type light emitting device of emitting a white-color light therefrom, i.e., suitable to be the display panel, the back light of the liquid crystal display device, or the light source of the lightening unit, etc., easily, through mixing a material for converting the blue-color light to the white-color light, into the transparent plate-like member 70 to be attached onto the (upper) surface of the reflector substrate 20 or the transparent resin 80 to be filled up within the inside of the through holes 11 and 21. Further, as such the material, there can be listed up one of mixing fine silica or YAG fluorescent substance into epoxy resin, for example.

Also, with the chip-type light emitting device mentioned above and the wiring substrate for that, and in particular, with the structures of the end surface electrodes 40 and 40, each of which is formed on the each end surface of the substrate made by piling up the base substrate 10 and the reflector substrate 20, since an upper end surface thereof is closed by a semi-circular conductor layer 41, when filling up the transparent resin 80 mentioned above, it will not reach to the electrode surfaces even if leaking out into an outside from the through holes 11 and 21, and therefore, it is possible to obtain the end surface electrodes 40 and 40, with certainty.

Figure 9:
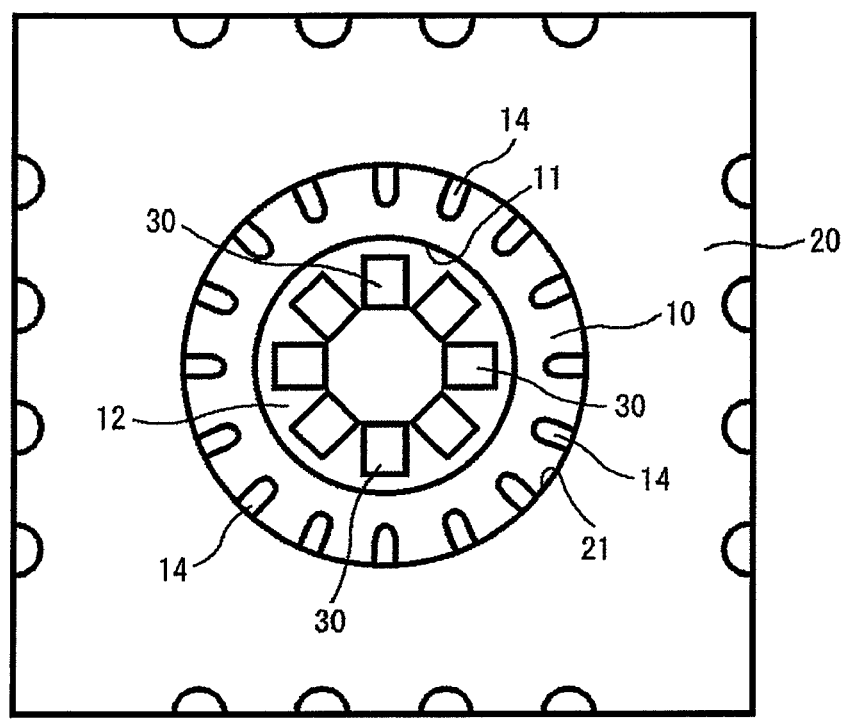
FIG. 9 is a top view for showing other example of alignment of the light emitting elements within the chip-type light emitting device mentioned above.
Figure 10:
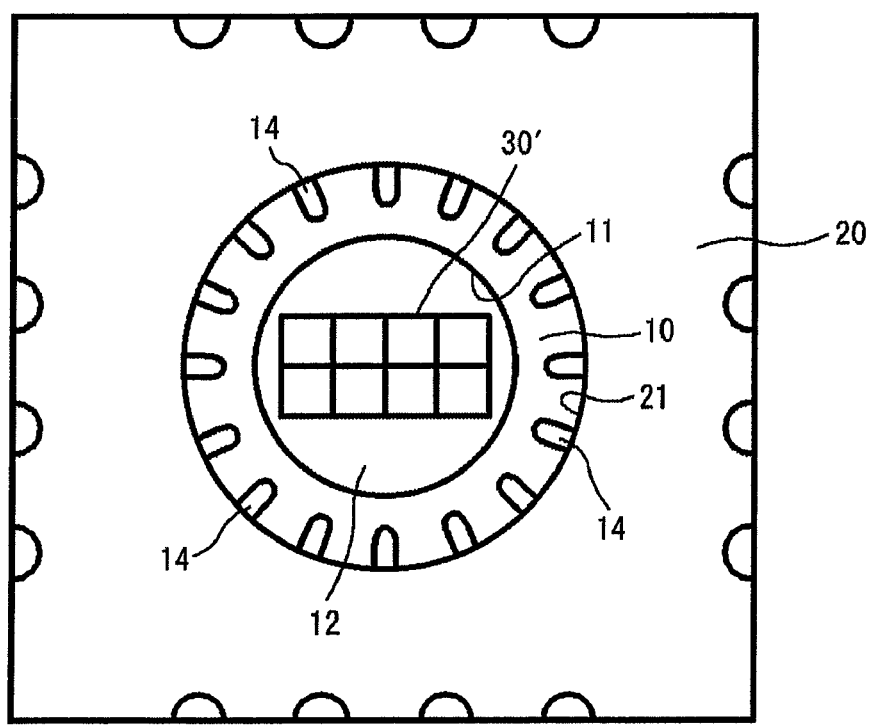
FIG. 10 is a top view for showing further other example of alignment of the light emitting elements within the chip-type light emitting device mentioned above.

Further, FIG. 9 attached herewith shows other example about alignment of the plural number of light emitting diodes, upon the surface of the heat radiating plate (i.e., the metal thin film) 12, which is provided the reverse (bottom) surface thereof, within the inside of the through hole 11 opened on the base substrate 10 mentioned above. Thus, in the above embodiment mentioned above, eight (8) pieces of the light emitting diodes 30, 30 . . . are disposed in four (4) lines and two (2) rows, respectively, as an example thereof. However, the present invention should not be restricted to the example mentioned above, but as is shown in this figure, they may be disposed along the inner peripheral surface of the though hole 11. Or alternately, in case where those eight (8) pieces of the light emitting diodes are supplied as one (1) piece of a block 30', for example, it may be disposed at around the central portion on the surface of the heat radiating plate (or the metal thin film) 12, within the inside of the though hole 11 mentioned above, as is shown in FIG. 10. Furthermore, it may be arranged in a way other than that.

In addition thereto, in FIG. 2 mentioned above is shown an example of the plural number of the wiring patterns 13, 13 . . . , which are formed on the upper surface of the base substrate 10, in the chip-type light emitting device mentioned above and the wiring substrate for that. As is apparent from this figure, the wiring patterns neighboring to each other are electrically connected with each other, in this embodiment. In more details thereof, it means that the wiring patterns to be connected with the "+" and "−" electrodes of a pair of the light emitting diodes, neighboring to each other, are aligned in the order, i.e., "+", "+", "−" and "−". Further, with such alignment or arrangement of the wiring patterns 13, 13 . . . , when electrically connecting the plural number of the light emitting diodes 30, 30 . . . disposed within the substrate between the wiring patterns 14, 14 . . . , through the wire bonding, etc., thereafter, there can be obtained an effect of avoiding the wires 15 and 15 wired from generating the short-circuiting between them, even if they come close to each other or are in contact with, because they are the same in the polarity thereof.

Further, although the explanation was made that the through holes 11 and 21, which are opened on the base substrate 10 and the reflector substrate 20, are circular in the shapes thereof, in the various embodiments mentioned above, however they should not be restricted only to that, according to the present invention, and they may be in an elliptic or a square, for example. However, it is apparent that the same effects as was mentioned above can be also obtained, in such the cases. Also, though the explanation was med that the through holes 11 and 21 opened on the base substrate 10 and the reflector substrate 20 are formed, extending the inner peripheral surfaces in the vertical direction, in the embodiments mentioned above, however they should not be restricted only to that, according to the present invention, and they may be formed inclining the inner peripheral surfaces thereof, with using a taper drill or the like, for example, when forming the through holes 11 and 21 on the substrates (see FIG. 3(b) or FIG. 4(b)).

Also in the above, the explanation was made that, in particular, the plural number of the light emitting elements disposed within the inside of the through hole 11 of the base substrate are eight (8) pieces of the light emitting diodes 30, 30 . . . , as one example thereof, within the chip-type light emitting device having such structures mentioned above, and the wiring substrate for that. However, according to the present invention, they should not be restricted to that, and they may be two (2) pieces or more than that (for example, four (4) pieces, six (6) pieces, nine (9) pieces, or ten (10) pieces, preferably), and also the light emitting elements should not be restricted only to the light emitting diodes, but as is apparent for the person skilled in the art, they may be other semiconductor light emitting elements. And, it is also possible to build up the plural number of the light emitting elements, which are disposed within the inside of the through hole 11 of the base substrate 10, with the light emitting diodes of a red-color, a green color, or a blue color, i.e., the three primary colors of the lights. Also, in that instance, by disposing the light emitting diodes of the three primary colors in the combination thereof, within the inside of the through hole 11 of the base substrate 10, it is possible to obtain a white-color light, or by combining at least two (2) kinds of them or more, it is possible to obtain a light of a color tone at desire.

EFFECT(S) OF THE INVENTION

As was mentioned above, according to the present invention, there can be obtained a superior effect of providing the chip-type light emitting device, enabling to obtain a high optical output with preferable conversion efficiency thereof, and also a wiring substrate for that.

EXPLANATION OF REFERENCE NUMERALS

10—Base Substrate
11—Through hole
12—Heat radiating plate
13—Reflection film
14.—Wiring patterns
15—Wires
20—Reflector substrate
21—Through hole
22—Reflection film
30—Light emitting diodes
40—Surface electrodes

What is claimed is:

1. A chip-type light emitting device, comprising:
an insulating substrate; and
light emitting elements mounted within an inside of said insulating substrate,
wherein said insulating substrate comprises a base substrate for mounting the light emitting elements, and a reflector substrate, being laminated and adhered on a surface of said base substrate,
wherein said base substrate is formed with a hole opening having a bottom surface wherein the light emitting elements are mounted on a part of the bottom surface, wiring patterns for electrically connecting said light emitting elements are formed, on an upper end periphery portion of the hole opening of said base substrate, and a heat radiation conductive body, formed on the bottom surface of said hole opening and providing said bottom surface, which is thicker than a thickness of a metal thin film forming said wiring patterns,
wherein said reflector substrate is formed with a through hole having a diameter larger than that of said hole opening, the through-hole is positioned concentrically over the hole opening of said base substrate,
wherein said wiring patterns contain parts functioning as light emitting element connecting lands that are formed near the outer periphery of the hole opening of said base substrate and which are exposed at the bottom surface of the through hole of said reflector substrate,
a reflection film formed at least on an inner peripheral surface of said through-hole, wherein said reflection film is comprised of a metal thin film, and
electrodes electrically connected with said wiring patterns and said light emitting elements are formed on end surfaces of said base substrate and said reflector substrate,
wherein the wiring patterns for connection with the electrodes are arrayed in a polarity order of "+", "+", "−" and "−" so that each of the wiring patterns has a neighboring wiring pattern of the same polarity adjacent thereto.

2. The chip-type light emitting device according to claim 1, wherein the reflection film, being formed on the inner peripheral surface of the through hole of said reflector substrate, and/or on the inner peripheral surface of the hole opening of said base substrate, is made from a metal thin film of any one of silver, nickel and aluminum, with each being superior in reflection efficiency to a white-color light.

3. The chip-type light emitting device according to claim 1, wherein on end surfaces of said base substrate and of said reflector substrate laminated and adhered thereon are further formed through holes in plural numbers thereof, penetrating through both substrates, to be cut out along a line connecting around centers of the through holes of said both substrates after mounting the light emitting elements therein, and on an inner periphery of said through holes are formed conductive layers, being electrically connected with the portions of said wiring patterns which are formed on the periphery portion of the hole opening of said base substrate, respectively, thereby providing terminal electrodes for connecting said light emitting elements to an external electrical connection.

4. The chip-type light emitting device according to claim 3, wherein through hole openings are formed in the terminal electrodes of said wiring substrates, being closed at either an upper end surface of said reflector substrate or a lower end surface of said base substrate in the through hole penetrating through both substrates, and both of the substrates are cut out along centers of the hole openings thereof at the end surfaces of the base and reflector substrates after mounting the light emitting elements therein, thereby providing the terminal electrodes.

5. The chip-type light emitting device according to claim 1, wherein the opening hole of said base substrate has a diameter taken from a range of 2.0-6.0 units of measurement of the thickness of the base substrate for mounting the plural pieces of light emitting elements within an inside of the hole opening.

6. The chip-type light emitting device according to claim 1, wherein the reflection surface on the inner periphery of the through hole, which is formed in the reflector substrate laminated and adhered on the upper surface of said base substrate, has a tapered shape widening an upper end surface relative to that of the bottom surface of said base substrate.

7. A wiring substrate for storing and mounting light emitting elements within an inside of an insulating substrate, comprising:

a base substrate for mounting thereon the light emitting elements; and a reflector substrate, being laminated and adhered on an upper surface of said base substrate, wherein said base substrate is formed with a hole opening having a bottom surface wherein the light emitting elements are mounted on a part of the bottom surface, wiring patterns for electrically connecting said light emitting elements are formed on an upper end periphery portion of the hole opening of said base substrate, and a heat radiating conductive body, formed on the bottom surface of said hole opening and providing said bottom surface, which is thicker than thickness of a metal thin film forming said wiring patterns, wherein said reflector substrate is formed with a through hole having a diameter larger than that of said hole opening, the through hole is positioned concentrically over the hole opening of said base substrates, wherein said wiring patterns contain parts functioning as light emitting element connecting lands that are formed near the outer periphery of the hole opening of said base substrate and which are exposed at the bottom surface of the through hole of said reflector substrate, a reflection film formed at least on an inner peripheral surface of said through-hole, wherein said reflection film is comprised of a metal thin film, and electrodes electrically connected with said wiring patterns and said light emitting elements are formed on end surfaces of said base substrate and said reflector substrate, wherein the wiring patterns for connection with the electrodes are arrayed in a polarity order of "+", "+", "−" and "−" so that each of the wiring patterns has a neighboring wiring pattern of the same polarity adjacent thereto.

8. The wiring substrate, according to claim 7, wherein the reflection film, being formed on the inner peripheral surface of the through hole of said reflector substrate, and/or on the inner peripheral surface of the hole opening of said base substrate, is made from a metal thin film of any one of silver, nickel and aluminum, with each being superior in reflection efficiency to a white-color light.

9. The wiring substrate according to claim 7, wherein on end surfaces of said base substrate and of said reflector substrate laminated and adhered thereon are further formed through holes in plural numbers thereof, penetrating through both substrates, to be cut out along a line connecting around centers of the through holes of said both substrates after mounting the light emitting elements therein, and on an inner periphery of said through holes are formed conductive layers, being electrically connected with the portions of said wiring patterns, which are formed on the periphery portion of the hole opening of said base substrate, respectively, thereby providing terminal electrodes for connecting said light emitting elements to an external electrical connection.

10. The wiring substrate according to claim 9, wherein holes are formed in the terminal electrodes, being closed at either an upper end surface of said reflector substrate or a lower end surface of said base substrate in the through hole penetrating through both substrates, and both of the substrates are cut out along centers of the through holes at the end surfaces of the base and reflector substrates after mounting the light emitting elements therein, thereby providing the terminal electrodes.

11. The wiring substrate, according to claim 7, wherein the hole opening of said base substrate has a diameter taken from a range of 2.0-6.0 units of measurement of the thickness of the base substrate for mounting the plural pieces of light emitting elements within an inside of the hole opening.

12. The wiring substrate according to claim 7, wherein the reflection surface on the inner periphery of the through hole, which is formed in the reflector substrate laminated and adhered on the upper surface of said base substrate, has a tapered shape widening an upper end surface relative to that of the bottom surface of said base substrate.

* * * * *